US010586500B2

(12) United States Patent
Liu

(10) Patent No.: US 10,586,500 B2
(45) Date of Patent: Mar. 10, 2020

(54) MULTIPLEXED TYPE DRIVER CIRCUIT, DRIVING METHOD AND DISPLAY

(71) Applicant: Shenzhen China Star Optoelectronics Semiconductor Display Technology Co., Ltd., Shenzhen, Guangdong (CN)

(72) Inventor: Linfeng Liu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/166,137

(22) Filed: Oct. 21, 2018

(65) Prior Publication Data

US 2019/0333457 A1    Oct. 31, 2019

Related U.S. Application Data

(63) Continuation of application No. PCT/CN2018/087936, filed on May 23, 2018.

(30) Foreign Application Priority Data

Apr. 27, 2018    (CN) .......................... 2018 1 0393929

(51) Int. Cl.
G09G 3/36        (2006.01)
H03K 17/687    (2006.01)

(52) U.S. Cl.
CPC ......... *G09G 3/3607* (2013.01); *G09G 3/3677* (2013.01); *G09G 2300/0452* (2013.01); *G09G 2300/0804* (2013.01); *G09G 2300/0809* (2013.01); *G09G 2310/0251* (2013.01); *G09G 2310/0297* (2013.01); *G09G 2320/0242* (2013.01); *H03K 17/6871* (2013.01)

(58) Field of Classification Search
CPC . G06F 3/038; G09G 5/00; G09G 3/30; G09G 3/36
See application file for complete search history.

(56) References Cited

U.S. PATENT DOCUMENTS

| 2007/0242016 | A1* | 10/2007 | Choi | G09G 3/3233 345/92 |
| 2009/0251455 | A1* | 10/2009 | Park | G09G 3/2007 345/214 |
| 2018/0197462 | A1* | 7/2018 | Nagayama | G09G 3/32 |
| 2019/0156768 | A1* | 5/2019 | Xing | G09G 3/3607 |

* cited by examiner

*Primary Examiner* — Pegeman Karimi

(57) ABSTRACT

The present disclosure provides a multiplexed type driver circuit, a driving method, and a display. The driver circuit may include: a fourth switch couple to a first switch and a first sub-pixel, a fifth switch couple to a second switch and a second sub-pixel, a sixth switch couple to a third switch and a third sub-pixel. The driving method may include: controlling ON and OFF of the first switch to input a data signal to the first sub-pixel; controlling ON and OFF of the second switch to input a data signal to the second sub-pixel; controlling ON of the third switch and OFF of the sixth switch to input a data signal to the third sub-pixel; and turning off the third switch after turning off the sixth switch. The durations of data signal input to the first sub-pixel, the second sub-pixel and the third sub-pixel are identical.

8 Claims, 7 Drawing Sheets

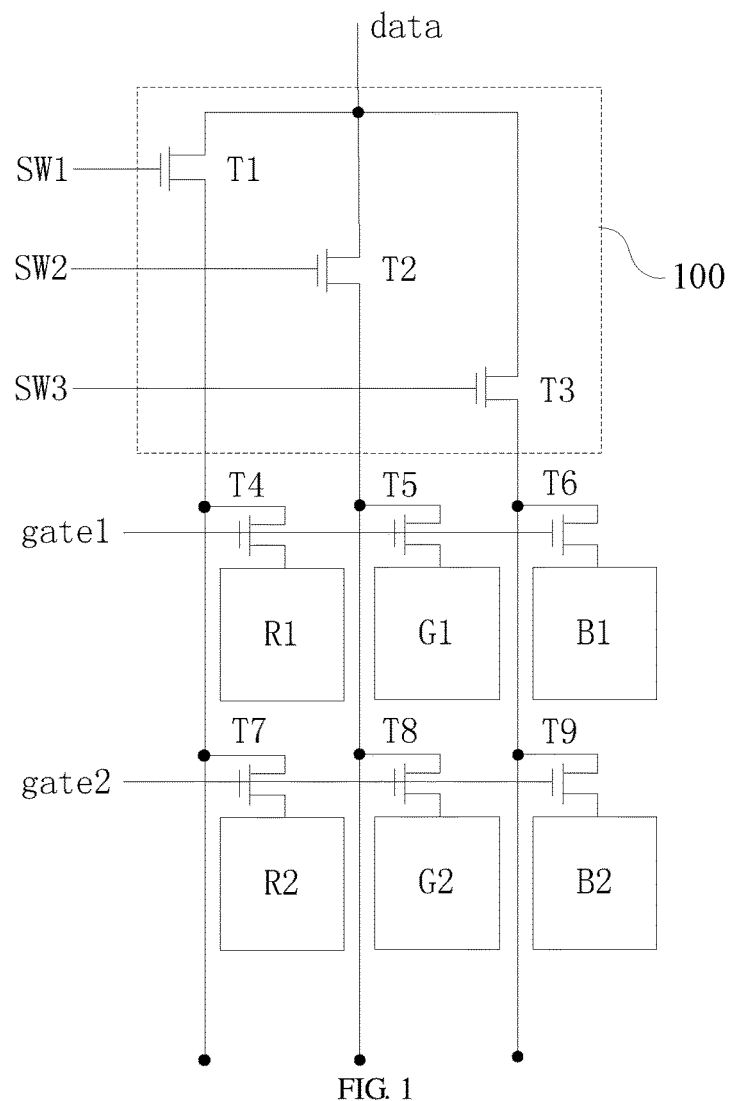
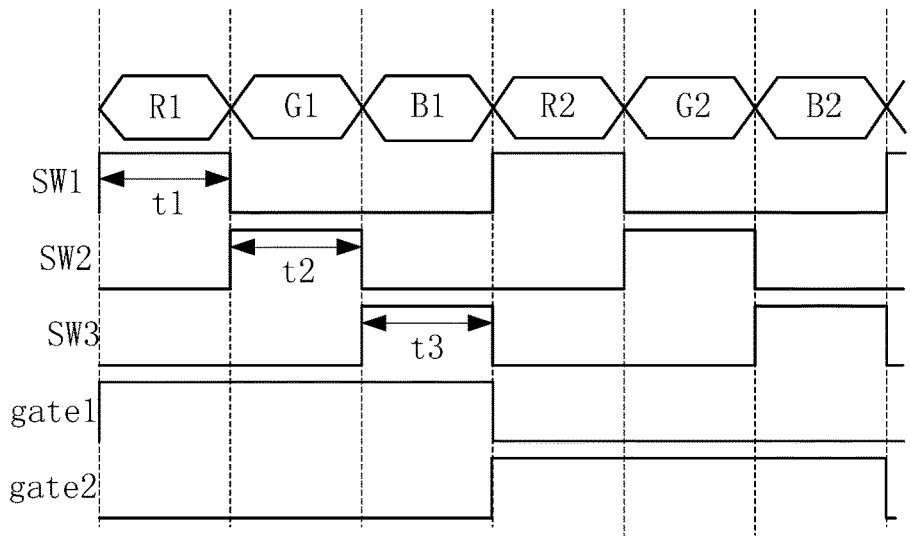
FIG. 2

MULTIPLEXED TYPE DRIVER CIRCUIT, DRIVING METHOD AND DISPLAY

CROSS-REFERENCE TO RELATED APPLICATIONS

The present application is a continuation-application of International (PCT) Patent Application No. PCT/CN2018/087936, filed on May 23, 2018, which claims foreign priority of Chinese Patent Application No. 201810393929.3, filed on Apr. 27, 2018 in the State Intellectual Property Office of China, the entire contents of all of which are hereby incorporated by reference.

TECHNICAL FIELD

The present disclosure relates to the display technology, and in particular, to a multiplexed type driver circuit, a driving method, and a display.

BACKGROUND

In all flat panel displays such as liquid crystal displays (LCD) and organic light emitting diode (OLED) displays, a plurality of arrayed pixels are included. Each pixel generally includes sub-pixels in red, green and blue, each of the sub-pixels controlled by a gate line and a data line. The gate line is used to control ON and OFF of the sub-pixels, while the data line applies different data voltage signals to the sub-pixels, such that the sub-pixels are displayed in different gray scales so as to realize full-color screen display.

SUMMARY

The technical problem primarily solved by the present disclosure is to provide a multiplexed type driver circuit, a driving method and a display, which can avoid a color shift caused by insufficient charging time of the third sub-pixel and thereby improves the display quality of the display.

In order to solve the technical problem mentioned above, one technical solution adopted by the present disclosure is: providing a multiplexed type driver circuit, applied to a display. The multiplexed type driver may include a plurality of scan signal lines, a plurality of data signal lines, and arrayed sub-pixels defined by the plurality of scan lines and the plurality of data lines; the multiplexed type driver circuit may further include a first switch, a second switch and a third switch, each of which may include an input end configured to input a data signal and an output end; a fourth switch may include an input end coupled to the output end of the first switch and an output end coupled to a first sub-pixel; a fifth switch may include an input end coupled to the output end of the second switch and an output end coupled to a second sub-pixel; and a sixth switch may include an input end coupled to the output end of the third switch and an output end coupled to a third sub-pixel; the first sub-pixel, the second sub-pixel and the third sub-pixel may be in a same pixel unit, the first sub-pixel may be a red sub-pixel, the second sub-pixel may be a green sub-pixel and the third sub-pixel may be a blue sub-pixel, the first switch, the second switch, the third switch, the fourth switch, the fifth switch and the sixth switch may be N-type field effect transistors; the multiplexed type driver circuit may perform the driving in the following manner: turning on the fourth switch, the fifth switch and the sixth switch; controlling ON and OFF of the first switch to input a data signal to the first sub-pixel; controlling ON and OFF of the second switch to input a data signal to the second sub-pixel; controlling ON of the third switch and OFF of the sixth switch to input a data signal to the third sub-pixel; and turning off the third switch after turning off the sixth switch. The durations of data signal input to the first sub-pixel, the second sub-pixel and the third sub-pixel are identical.

In order to solve the technical problem mentioned above, one technical solution adopted by the present disclosure is: providing a method for driving a multiplexed type driver circuit. The multiplexed type driver circuit may include: a first switch, a second switch and a third switch, each of which may include an input end configured to input a data signal; a fourth switch may include an input end coupled to the output end of the first switch and an output end coupled to a first sub-pixel; a fifth switch may include an input end coupled to the output end of the second switch and an output end coupled to a second sub-pixel; and a sixth switch may include an input end coupled to the output end of the third switch and an output end coupled to a third sub-pixel; the first sub-pixel, the second sub-pixel and the third sub-pixel may be in a same pixel unit. The driving method may include: turning on the fourth switch, the fifth switch and the sixth switch; controlling ON and OFF of the first switch to input a data signal to the first sub-pixel; controlling ON and OFF of the second switch to input a data signal to the second sub-pixel; controlling ON of the third switch and OFF of the sixth switch to input a data signal to the third sub-pixel; and turning off the third switch after turning off the sixth switch, the durations of data signal input to the first sub-pixel, the second sub-pixel and the third sub-pixel are identical.

In order to solve the technical problem mentioned above, one technical solution adopted by the present disclosure is: providing a display. The display may include a multiplexed type driver circuit. The multiplexed type driver circuit may include: a first switch, a second switch and a third switch, each of which may include an input end configured to input a data signal and an output end; and a fourth switch may include an input end coupled to the output end of the first switch and an output end coupled to a first sub-pixel; a fifth switch may include an input end coupled to the output end of the second switch and an output end coupled to a second sub-pixel; and a sixth switch may include an input end coupled to the output end of the third switch and an output end coupled to a third sub-pixel; the first sub-pixel, the second sub-pixel and the third sub-pixel are in a same pixel unit. The multiplexed type driver circuit may perform the driving in the following manner: turning on the fourth switch, the fifth switch and the sixth switch; controlling ON and OFF of the first switch to input a data signal to the first sub-pixel; controlling ON and OFF of the second switch to input a data signal to the second sub-pixel; controlling ON of the third switch and OFF of the sixth switch to input a data signal to the third sub-pixel; and turning off the third switch after turning off the sixth switch, and the durations of data signal input to the first sub-pixel, the second sub-pixel and the third sub-pixel are identical.

Comparing with the related art, the present disclosure performs a multiplexed type driver circuit, including: a first switch, a second switch and a third switch, each of which may include an input end configured to input a data signal and an output end; a fourth switch may include an input end coupled to the output end of the first switch and an output end coupled to a first sub-pixel; a fifth switch may include an input end coupled to the output end of the second switch and an output end coupled to a second sub-pixel; and a sixth switch may include an input end coupled to the output end of the third switch and an output end coupled to a third sub-pixel; the first sub-pixel, the second sub-pixel and the third sub-pixel are in a same pixel unit,. The driving method includes: turning on the fourth switch, the fifth switch and the sixth switch; controlling ON and OFF of the first switch to input a data signal to the first sub-pixel; controlling ON and OFF of the second switch to input a data signal to the second sub-pixel; controlling ON of the third switch and OFF of the sixth switch to input a data signal to the third sub-pixel; and turning off the third switch after turning off the sixth switch, and the durations of data signal input to the first sub-pixel, the second sub-pixel and the third sub-pixel are identical. The ON and OFF times of the first switch, the second switch and the third switch are adjusted to ensure that the charging time of each sub-pixel is identical, therefore, a color shift caused by insufficient luminescence time of a certain sub-pixel could be avoided, and the display quality of the display could be improved.

BRIEF DESCRIPTION OF THE DRAWINGS

In order to describe the technical solutions in the embodiments of the present disclosure more clearly, the drawings illustrative of the embodiments will be briefly described below. Obviously, the drawings in the following description only represent some embodiments of the present disclosure, and for those of ordinary skill in the art, other drawings may also be obtained based on these drawings without any creativity. Among them:

FIG. 1 is a schematic structural view of a multiplexed type driver circuit according to an embodiment of the present disclosure.

FIG. 2 is a signal diagram of a conventional multiplexed type driver circuit.

DETAILED DESCRIPTION

Figure 3:
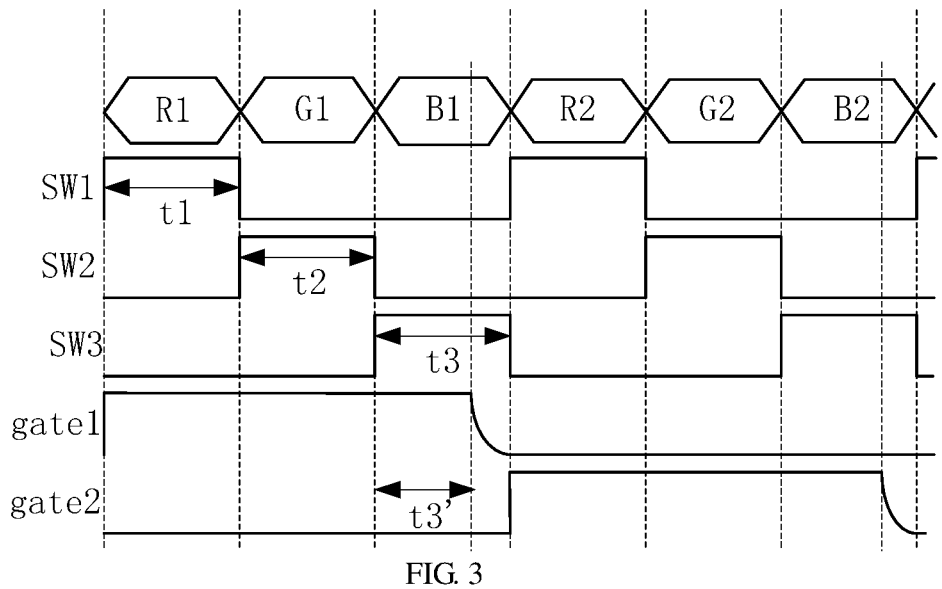
FIG. 3 is another signal diagram of a conventional multiplexed type driver circuit.

The technical solutions in the embodiments of the present disclosure will now be described clearly and completely in connection with the accompanying drawings. It is to be understood that the specific embodiments described herein are only used to interpret, rather than limit, the present disclosure. It should also be noted that for ease of description, only some but not all of the structures related to the present disclosure are shown in the drawings. All other embodiments obtained by a person of ordinary skill in the art based on the embodiments of the present disclosure without creative efforts shall fall within the protection scope of the present disclosure.

The terms "first", "second" and the like in the present disclosure are used to distinguish different objects rather than indicate a specific sequence. Additionally, the terms "include" and "have" and any variants thereof are intended to encompass non-exclusive inclusions. For example, a process, method, system, product, or apparatus comprising a series of blocks or components is not limited to the listed blocks or components, but may optionally include blocks or components that are not listed, or alternatively include other blocks or components inherent to the process, method, system, product, or apparatus.

References herein to "an embodiment" mean that a particular feature, structure, or characteristic described in connection with an embodiment can be included in at least one embodiment of the present disclosure. The appearances of such phrases in various places in the description are not necessarily all referring to the same embodiment, nor are separate or alternative embodiments mutually exclusive of other embodiments. It will be understood by those skilled in the art, both explicitly and implicitly, that the embodiment described herein can be combined with other embodiments.

Now reference is made to FIG. 1, a schematic structural view of a multiplexed type driver circuit provided by the present disclosure is depicted. The multiplexing driver circuit may include a plurality of driving units 100.

The driving units 100 may also be called de-multiplexers (DEMUXs), which utilize switches to perform time division multiplexing on the data signal input to reduce the number and cost of data signal circuits. In the present embodiment, a same data signal may drive three columns of sub-pixels after time division multiplexing.

Taking FIG. 1 as an example, each of the driving units may include at least a first switch T1, a second switch T2, and a third switch T3, each of which may include an input end configured to input a data signal (data), an output end and a control end.

Additionally, each sub-pixel also may include a switch. Taking a first sub-pixel, a second sub-pixel, and a third sub-pixel which are adjacent in a same pixel unit in the first row as an example. The first sub-pixel may be provided with a fourth switch T4, the second sub-pixel may be provided with a fifth switch T5, and the third sub-pixel may be provided with a sixth switch T6. The fourth switch T4 may include an input end coupled to the output end of the first switch T1 and an output end coupled to the first sub-pixel, the fifth switch T5 may include an input end coupled to the output end of the second switch T2 and an output end coupled to the second sub-pixel, and the sixth switch T6 may include an input end coupled to the output end of the third switch T3 and an output end coupled to the third sub-pixel.

In the second row, The first sub-pixel may be provided with a seventh switch T7, the second sub-pixel may be provided with a eighth switch T8, and the third sub-pixel may be provided with a sixth ninth T9. The seventh switch T7 may include an input end coupled to the output end of the first switch T1 and an output end coupled to the first sub-pixel, the eighth switch T8 may include an input end coupled to the output end of the second switch T2 and an output end coupled to the second sub-pixel, and the ninth switch T9 may include an input end coupled to the output end of the third switch T3 and an output end coupled to the third sub-pixel.

In some embodiments, the first sub-pixel may be a red sub-pixel R, the second sub-pixel may be a green sub-pixel G, and the third sub-pixel may be a blue sub-pixel B. The first sub-pixel, the second sub-pixel and the third sub-pixel may be in the same pixel unit.

In some embodiments, the control end of the first switch T1 may input a first control signal SW1, the control end of the second switch T2 may input a second control signal SW2, and the control end of the third switch T3 may input a third control signal SW3. These switches can be field effect transistors (FET). The ON and OFF states of the FETs may be controlled by different levels. For example, if the control signal is at a first level, the switch can be turned on; and if the control signal is at a second level, the switch can be turned off. Specifically, take an N-type FET for an example. If the control signal is at a high level, the switch may be turned on; if the control signal is at a low level, the switch may be turned off. Of course, a P-type field effect transistor may also be used in other embodiments, under this circumstance, the switch may be turned on when the control signal is at the low level and turned off when the control signal is at the high level.

In some embodiments, the fourth switch T4, the fifth switch T5, and the sixth switch T6 are generally thin film transistors (TFTs). Each of these switches may include a control end coupled to a gate line to receive a scan signal (gate), an input end coupled to a data line to receive a data signal, and an output end coupled to a pixel electrode of a sub-pixel to charge the pixel electrode with the voltage provided by the data signal when the switches are turned on, thereby realizing display.

It can be understood that for each sub-pixel in this embodiment, the data signal (data) can only be input to the pixel electrode of the sub-pixel for charging when two corresponding switches are turned on at the same time. For example, when the first switch T1 and the fourth switch T4 are simultaneously turned on, the data signal (data) can be input to the pixel electrode of the first sub-pixel to charge the pixel.

Additionally, the present embodiment is illustrated with only three sub-pixels in one pixel. The display panel generally includes a plurality of pixels arranged in arrays. As shown in FIG. 1, the three sub-pixels in the second row are coupled to a second gate drive line. No details will be covered herein.

Referring to FIG. 2, a signal diagram of a conventional multiplexed type driver circuit is depicted. Each cycle of the data signals may include a first sub-cycle, a second sub-cycle and a third sub-cycle in sequence. The first switch T1 may be turned on in the first sub-cycle, the second switch T2 may be turn on in the sub-cycle, and the third switch T3 may be turned on in the third sub-cycle, so as to charge the corresponding sub-pixels through data signals. The control end of the first switch T1 may input the first control signal SW1, the control end of the second switch T2 may input the second control signal SW2, and the control end of the third switch T3 may input the third control signal SW3, such that a corresponding switch is turned on when the control signal is at the first level, and is turned off when the control signal is at the second level.

Specifically, in the first cycle, the first row may be scanned, a scan signal gate1 is at a high level, the forth switch T4, the fifth switch T5, and the fifth switch T6 are all turned on. Further, the cycle may be divided into three sub-cycles. In the first sub-cycle, the first control signal SW1 is at the high level, the first switch T1 is ON, and the data signal may charge the first sub-pixel. In the second sub-cycle, the second control signal SW2 is at the high level, the second switch T2 is ON, and the data signal may charge the second sub-pixel. In the third sub-cycle, the third control signal SW3 is at the high level, the third switch T3 is ON, and the data signal may charge the third sub-pixel. It should be noted that the first sub-pixel, the second sub-pixel and the third sub-pixel herein are three sub-pixels of a certain pixel unit in the first row of pixels.

Similarly, when scanning the second row, a scan signal gate2 is at a high level, the seventh switch T7, the eighth switch T8, and the ninth switch T9 are all ON. Further, the cycle may be divided into three sub-cycles. In the first sub-cycle, the first control signal SW1 is at a high level, the first switch T1 is ON, and the data signal may be charge the first sub-pixel. In the second sub-cycle, the second control signal SW2 is at a high level, the second switch T2 is ON, and the data signal may charge the second sub-pixel. In the third sub-cycle, the third control signal SW3 is at a high level, the third switch T3 is ON, and the data signal may charge the third sub-pixel. It should be noted that the first sub-pixel, the second sub-pixel, and the third sub-pixel herein are three sub-pixels of a certain pixel unit in the second row of pixels.

Referring to FIG. 3, another signal diagram of a conventional multiplexed type driver circuit is depicted. It can be understood that the display generally performs progressive scanning. Upon completion of the scanning of the first row, the scan signal gate1 is changed to a low level to turn off the forth switch T4, the fifth switch T5, and the sixth switch T6. In order to prevent a mischarge of data signals resulted from not turning off field effect transistors in time, the scan signal gate1 is generally brought to a low level in advance.

Taking the first row of pixels as an example, it can be seen from FIG. 3 that the high level durations t1 of the first control signal SW1, the high level durations t2 of the second control signal SW2, and the high level durations t3 of the third control signal SW3 may be equal. However, in the duration of the high level of the third control signal SW3, i.e., when the third switch T3 is not yet turned off, the scan signal gate1 has been brought to a low level to turn off the seventh switch T7, the eighth switch T8, and the ninth switch T9. As a result, charging time (the time when the third control signal SW3 and the scan gate1 are both at the high level) for the third sub-pixel (i.e., the blue sub-pixel) may be insufficient, which may result in a color shift. Specifically, the charging time of the first sub-pixel is t1, the charging time of the second sub-pixel is t2, and the charging time of the third sub-pixel is smaller than t3; the third sub-pixel is only charged during t3' when both the third control signal SW3 and the scan gate1 are at the high level.

The above problem is solved through several embodiments of the driving method as follows.

Figure 4:
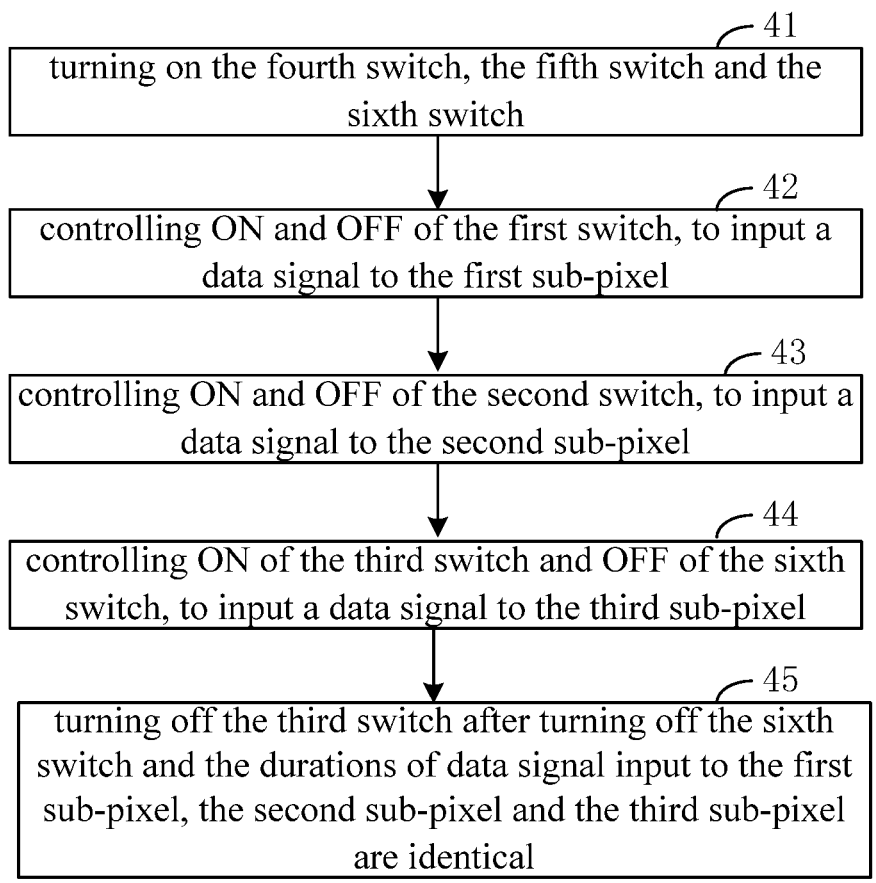
FIG. 4 is a flow chart diagram of a method for driving a multiplexed type driver circuit according to a first embodiment of the present disclosure.

Referring to FIG. 4, a flow chart diagram of a method for driving a multiplexed type driver circuit according to a first embodiment of the present disclosure is depicted. The driving method may include the following blocks.

Block 41: turning on the fourth switch, the fifth switch and the sixth switch.

At block 41, the first sub-pixel, the second sub-pixel, and the third sub-pixel may be turned on by inputting a high-level signal to the scan lines in the row where the first sub-pixel, the second sub-pixel, and the third sub-pixel are located.

Block 42: controlling ON and OFF of the first switch, to input a data signal to the first sub-pixel.

Block 43: controlling ON and OFF of the second switch, to input a data signal to the second sub-pixel.

Block 44: controlling ON of the third switch and OFF of the sixth switch, to input a data signal to the third sub-pixel.

At blocks 42-44, the first switch T1, the second switch T2 and the third switch T3 are sequentially turned on; it should be noted that the sixth switch T6 is turned off before the third switch T3 is turned off, such that the data signal (data) will not be mistakenly charged to the pixels in the next row when the switches in next row are turned on.

Block 45: turning off the third switch after turning off the sixth switch and the durations of data signal input to the first sub-pixel, the second sub-pixel and the third sub-pixel are identical.

Through block 45, it is ensured that the charging time durations of the three sub-pixels are identical. In the following, several specific embodiments will be described.

Figure 5:
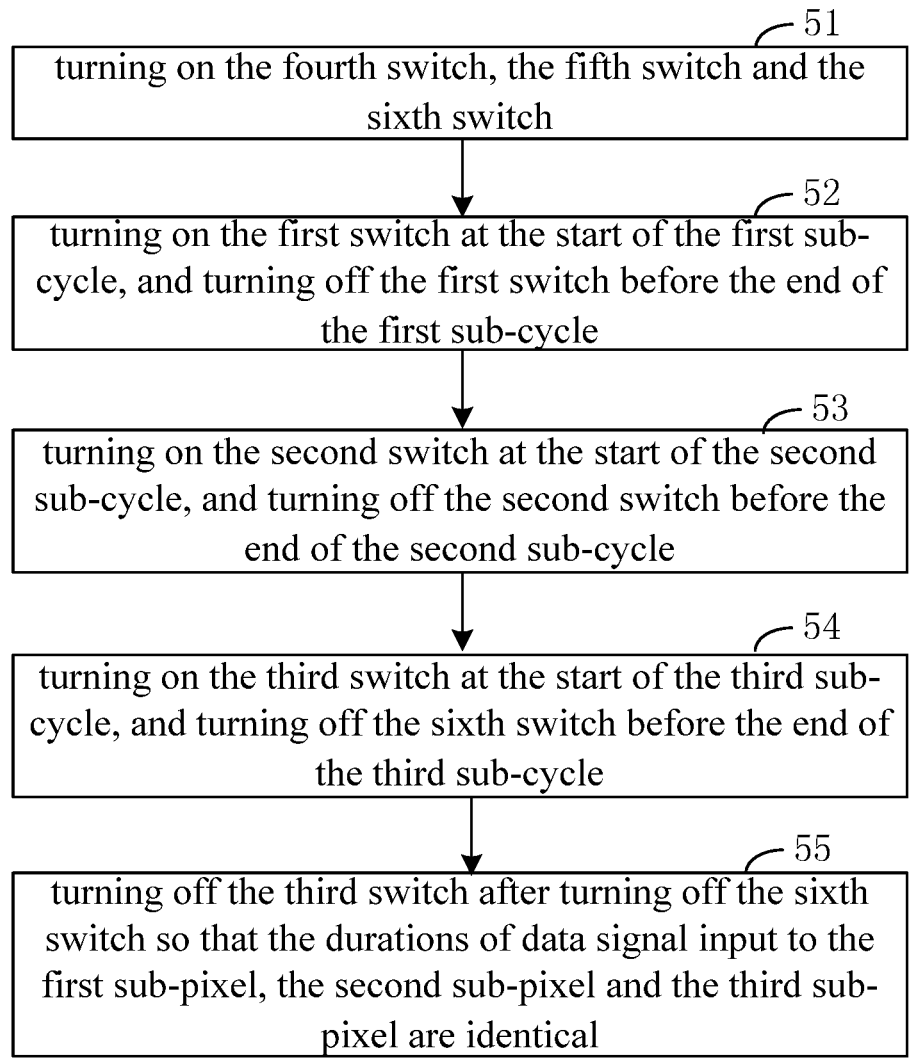
FIG. 5 is a flow chart diagram of a method for driving a multiplexed type driver circuit according to a second embodiment of the present disclosure.

Referring to FIG. 5, a flow chart diagram showing a method for driving a multiplexed type driver circuit according to a second embodiment of the present disclosure is depicted. The driving method may include the following blocks.

Block 51: turning on the fourth switch, the fifth switch and the sixth switch.

Block 52: turning on the first switch at the start of the first sub-cycle, and turning off the first switch before the end of the first sub-cycle.

Block 53: turning on the second switch at the start of the second sub-cycle, and turning off the second switch before the end of the second sub-cycle.

Block 54: turning on the third switch at the start of the third sub-cycle, and turning off the sixth switch before the end of the third sub-cycle. and Block 55: turning off the third switch after turning off the sixth switch so that the durations of data signal input to the first sub-pixel, the second sub-pixel and the third sub-pixel are identical.

Figure 6:
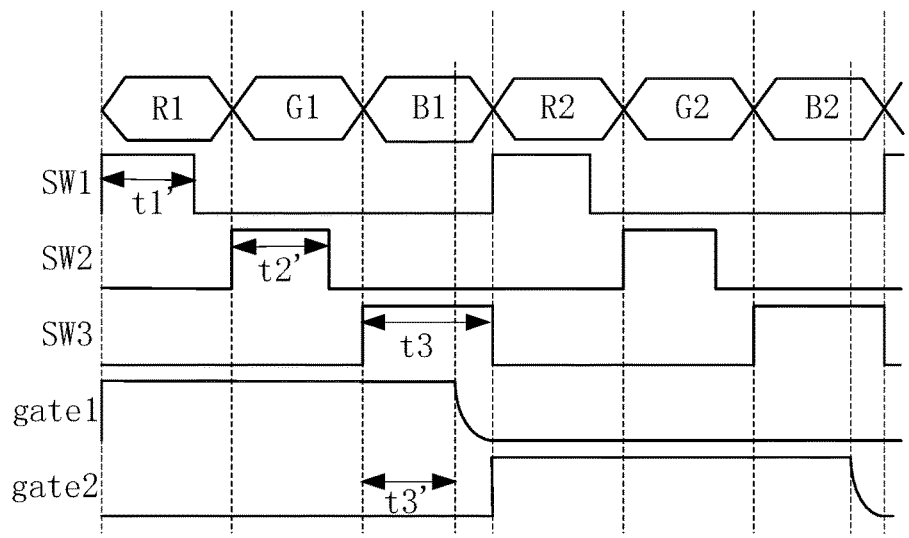
FIG. 6 is a signal diagram of FIG. 5.

Referring to FIG. 6, a signal diagram of FIG. 5 is depicted. In this embodiment, each cycle of the data signals may be divided into a first sub-cycle, a second sub-cycle, and a third sub-cycle.

It can be appreciated that turning off of the gate in advance may lead to an undercharge of the third sub-pixel and further lead to a color shift. The direct reason may be that the charging time of the third sub-pixel is smaller than that of the first sub-pixel and the second sub-pixel. In the present embodiment, the first switch T1 and the second switch T2 are turned off in advance on the basis of those mentioned above to shorten the ON time of the first switch T1 and the second switch T2, while the ON time for the third switch T3 is not changed, such that the ON time of the third switch T3 is greater than that of the first switch T1 and the second switch T2. As such, under the condition that the third switch T3 and the sixth switch T6 are simultaneously ON, the sixth switch T6 is turned off earlier than that of the third switch T3. As a result, the charging time of the third sub-pixel may be shortened, such that the charging time of the three sub-pixels can still be kept identical, thereby avoiding a color shift.

Specifically, regarding to the rising edge and the falling edge of the control signals, the rising edge for the high level of the first control signal SWl may correspond to the starting time of the first sub-cycle, and the falling edge for the high level of the first control signal SWl may be earlier than the ending time of the first sub-cycle; the rising edge for the high level of the second control signal SW2 may correspond to the starting time of the second sub-cycle, and the falling edge for the high level of the second control signal SW2 may be earlier than the ending time of the second sub-cycle; the rising edge and the falling edge for the high level of the third control signal SW3 correspond to the starting and ending times of the third sub-cycle respectively.

It can be understood that the charging time of each of the sub-pixels can be adjusted with the signal control method described above, and specifically, the charging time of different sub-pixels in a same pixel unit can be controlled to be identical.

Figure 7:
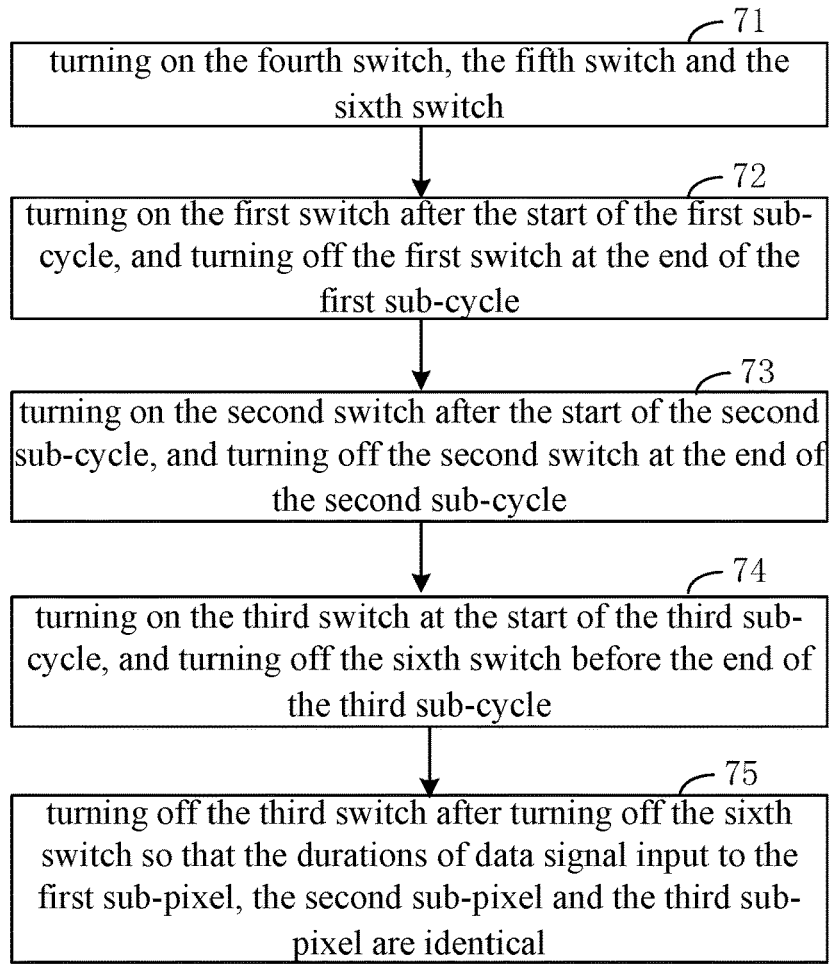
FIG. 7 is a flow chart diagram of a method for driving a multiplexed type driver circuit according to a third embodiment of the present disclosure.

Referring to FIG. 7, a flow chart diagram of a method for driving a multiplexed type driver circuit according to a third embodiment of the present disclosure is depicted. The driving method may include the following blocks.

Block 71: turning on the fourth switch, the fifth switch and the sixth switch.

Block 72: turning on the first switch after the start of the first sub-cycle, and turning off the first switch at the end of the first sub-cycle.

Block 73: turning on the second switch after the start of the second sub-cycle, and turning off the second switch at the end of the second sub-cycle.

Block 74: turning on the third switch at the start of the third sub-cycle, and turning off the sixth switch before the end of the third sub-cycle. and Block 75: turning off the third switch after turning off the sixth switch so that the durations of data signal input to the first sub-pixel, the second sub-pixel and the third sub-pixel are identical.

Figure 8:
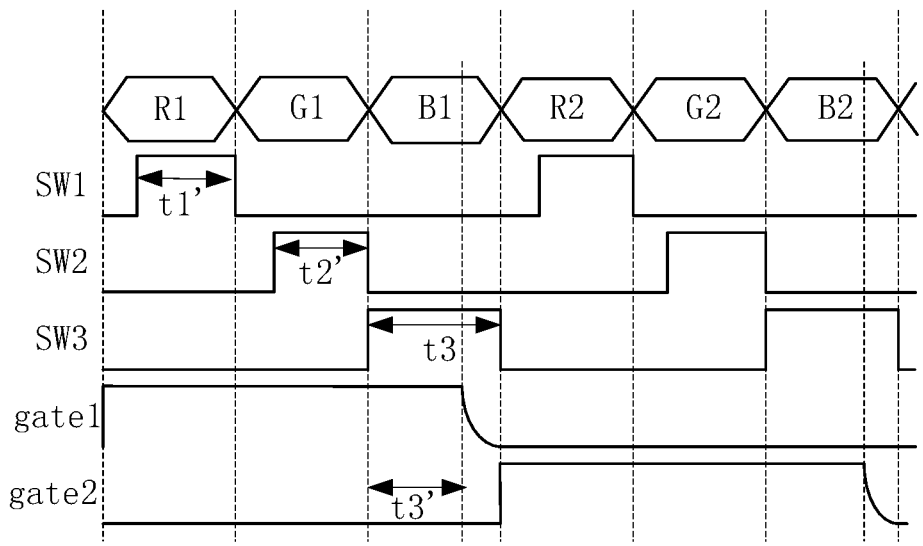
FIG. 8 is a signal diagram of FIG. 7.

Referring to FIG. 8, a signal diagram of FIG. 7 is depicted. In this embodiment, each cycle of the data signals may be divided into a first sub-cycle, a second sub-cycle, and a third sub-cycle.

It can be appreciated that turning off of the gate in advance may lead to an undercharge of the third sub-pixel and further lead to a color shift. The direct reason may be that the charging time of the third sub-pixel is smaller than that of the first sub-pixel and the second sub-pixel. In the present embodiment, the first switch T1 and the second switch T2 are turned off in advance on the basis of those mentioned above to shorten the ON time of the first switch T1 and the second switch T2, while the ON time for the third switch T3 is not changed, such that the ON time of the third switch T3 is greater than that of the first switch T1 and the second switch T2. As such, under the condition that the third switch T3 and the sixth switch T6 are simultaneously ON, the sixth switch T6 is turned off earlier than that of the third switch T3. As a result, the charging time of the third sub-pixel may be shortened, such that the charging time of the three sub-pixels can still be kept identical, thereby avoiding a color shift.

Specifically, regarding to the rising edge and the falling edge of the control signals, the rising edge for the high level of the first control signal SW1 may be later than the starting time of the first sub-cycle, and the falling edge for the high level of the first control signal SW1 may correspond to the ending time of the first sub-cycle; the rising edge for the high level of the second control signal SW2 may be later than the starting time of the second sub-cycle, and the falling edge for the high level of the second control signal SW2 may correspond to the ending time of the second sub-cycle; the rising edge and the falling edge for the high level of the third control signal SW3 correspond to the starting and ending times of the third sub-cycle respectively.

It can be understood that the charging time of each of the sub-pixels can be adjusted with the signal control method described above, and specifically, the charging time of different sub-pixels in a same pixel unit can be controlled to be identical.

Of course, in other embodiments, the rising edge and the falling edge for the high level of the first control signal SW1 and the second control signal SW2 do not necessarily correspond to the starting time and the ending time of each sub-cycle. For example, the rising edge for the high level of the first control signal SW1 is later than the starting time of the first sub-cycle, and the falling edge for the high level of the first control signal SW1 is earlier than the ending time of the first sub-cycle, as long as the high level duration of the first control signal SW1 is kept within the first sub-cycle and shorter than the first sub-cycle in length.

Figure 9:
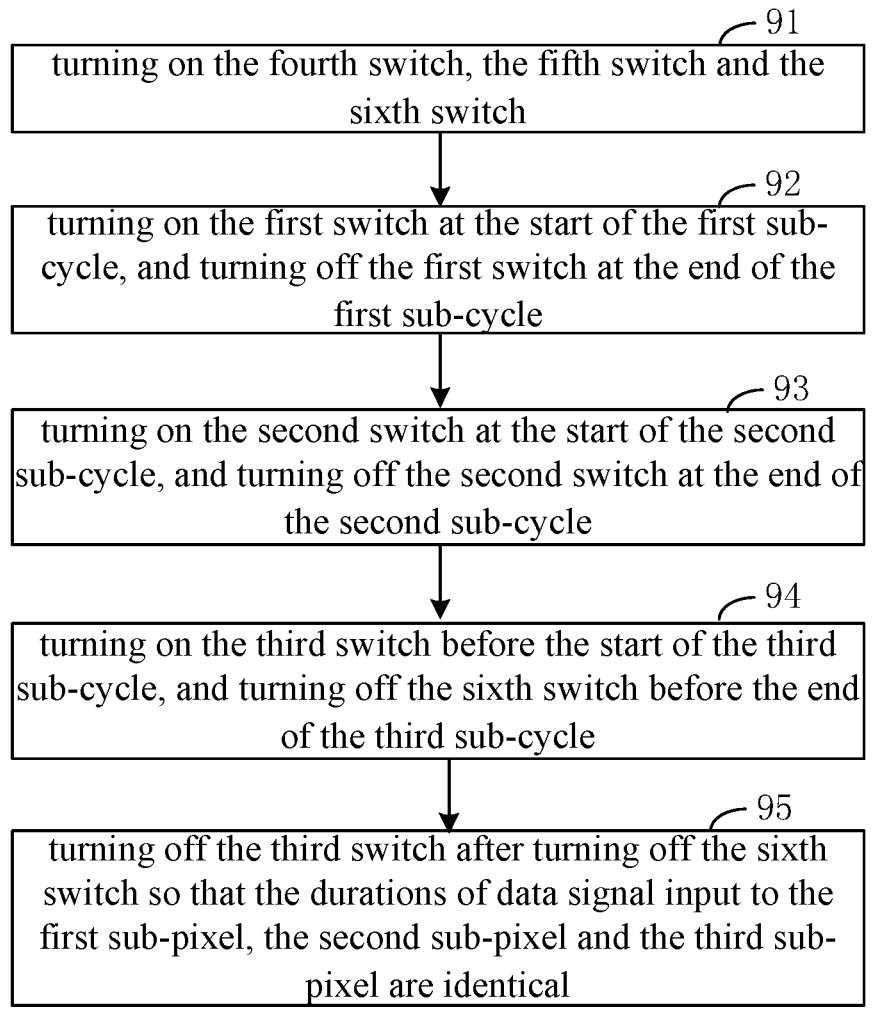
FIG. 9 is a flow chart diagram of a method for driving a multiplexed type driver circuit according to a fourth embodiment of the present disclosure.

Referring to FIG. 9, a schematic flow chart diagram of a method for driving a multiplexed type driver circuit according to a fourth embodiment of the present disclosure is depicted., wherein the driving method may include the following blocks.

Block 91: turning on the fourth switch, the fifth switch and the sixth switch.

Block 92: turning on the first switch at the start of the first sub-cycle, and turning off the first switch at the end of the first sub-cycle.

Block 93: turning on the second switch at the start of the second sub-cycle, and turning off the second switch at the end of the second sub-cycle.

Block 94: turning on the third switch before the start of the third sub-cycle, and turning off the sixth switch before the end of the third sub-cycle. and Block 95: turning off the third switch after turning off the sixth switch so that the durations of data signal input to the first sub-pixel, the second sub-pixel and the third sub-pixel are identical.

Figure 10:
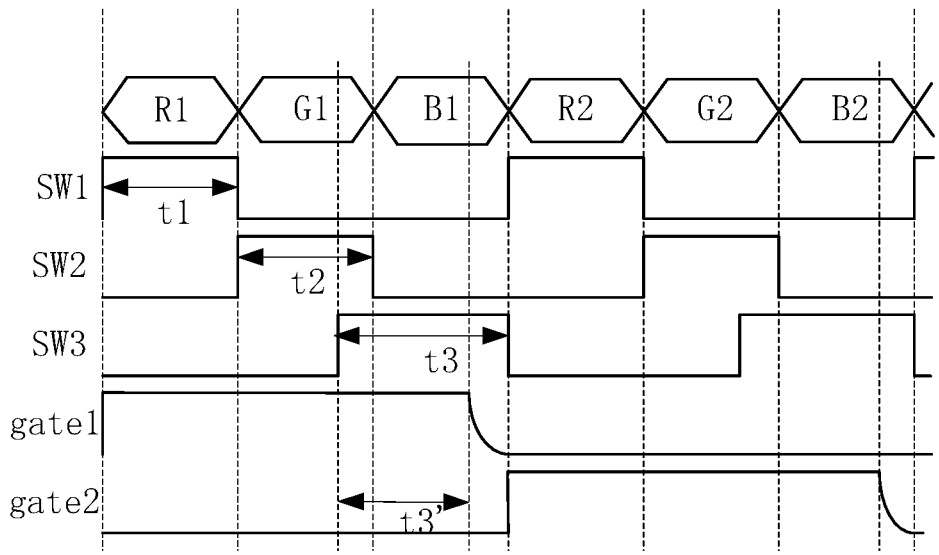
FIG. 10 is a signal diagram of FIG. 9.

Referring to FIG. 10, a signal diagram of FIG. 9 is depicted. In this embodiment, each cycle of the data signals may be divided into a first sub-cycle, a second sub-cycle, and a third sub-cycle.

It can be appreciated that turning off of the gate in advance may lead to an undercharge of the third sub-pixel and further lead to a color shift. The direct reason may be that the charging time of the third sub-pixel is smaller than that of the first sub-pixel and the second sub-pixel. In the present embodiment, the third switch T3 is turned on ahead of time on the basis of those mentioned above to prolong the ON time of the third switch T3, such that the ON time of T3 is greater than that of the first switch T1 and the second switch T2. As such, under the condition that the third switch T3 and the sixth switch T6 are simultaneously ON, the sixth switch T6 is turned off earlier than that of the third switch T3. As a result, the charging time of the third sub-pixel may be shortened, such that the charging time of the three sub-pixels can still be kept identical, thereby avoiding a color shift.

Specifically, the rising edge and the falling edge for the high level of the first control signal SW1 may correspond to the starting and ending times of the first sub-cycle respectively, and the rising edge and the falling edge for the high level of the second control signal SW2 may correspond to the starting and ending times of the second sub-cycle respectively. Before the end of the second sub-cycle, the third switch T3 is turned on in advance, and during this period, the second sub-pixel and the third sub-pixel are simultaneously charged. Then, the second control signal SW2 falls to a low level, the second switch T2 is turned off, and the second sub-pixel stops charging; the third control signal SW3 still maintains a high level, the third switch T3 is kept ON, and the third sub-pixel continues to be charged; the third switch T3 is not turned off until the end of the third sub-cycle.

In the above manner, when the gate is lowered to a low level to turn off the pixel switch of the third sub-pixel earlier, although the charging of the third sub-pixel is ended prematurely, since the third sub-pixel starts to be charged ahead of time, the charging time of the third sub-pixel is the same as that of the first and second sub-pixels, which ensures that the charging time of each sub-pixel is the same, thereby avoiding a color shift caused by insufficient luminescence time of a certain primary color, and improving the display quality of the display.

Figure 11:
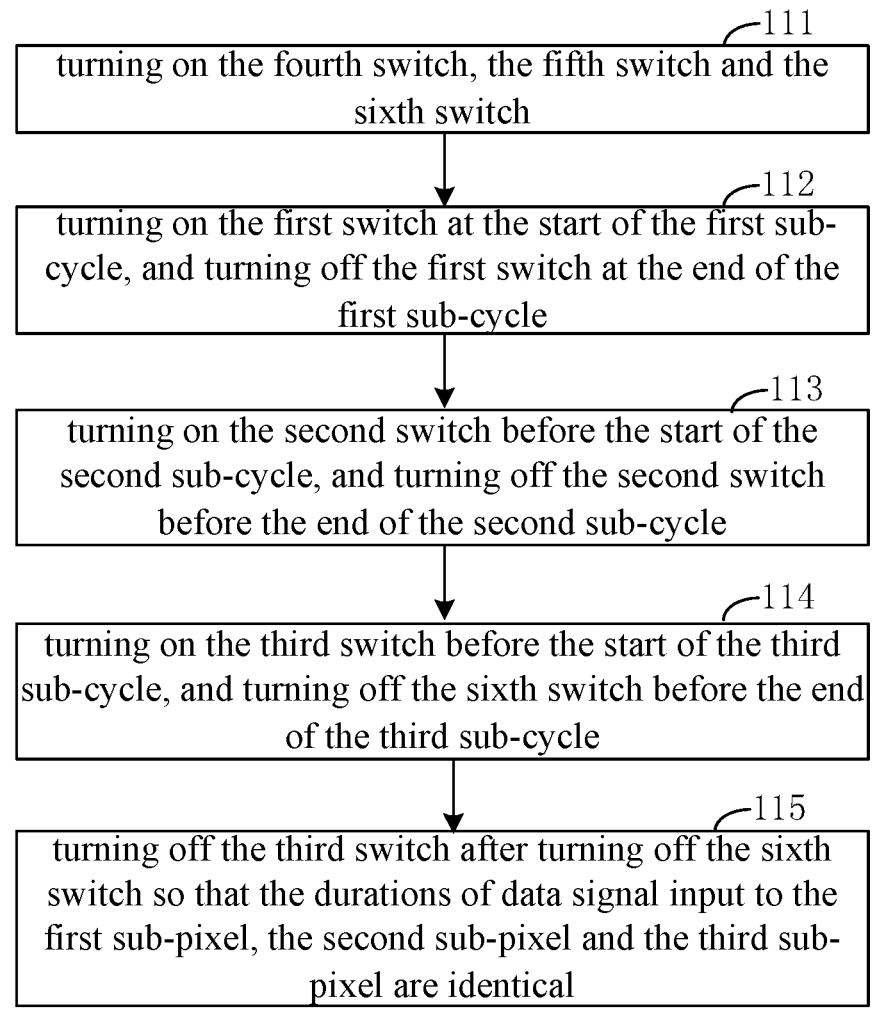
FIG. 11 is a flow chart diagram of a method for driving a multiplexed type driver circuit according to a fifth embodiment of the present disclosure.

Referring to FIG. 11, a flow chart diagram of a method for driving a multiplexed type driver circuit according to a fifth embodiment of the present disclosure is depicted. The driving method may include the following blocks.

Block 111: turning on the fourth switch, the fifth switch and the sixth switch.

Block 112: turning on the first switch at the start of the first sub-cycle, and turning off the first switch at the end of the first sub-cycle.

Block 113: turning on the second switch before the start of the second sub-cycle, and turning off the second switch before the end of the second sub-cycle.

Block 114: turning on the third switch before the start of the third sub-cycle, and turning off the sixth switch before the end of the third sub-cycle. and Block 115: turning off the third switch after turning off the sixth switch so that the durations of data signal input to the first sub-pixel, the second sub-pixel and the third sub-pixel are identical.

Figure 12:
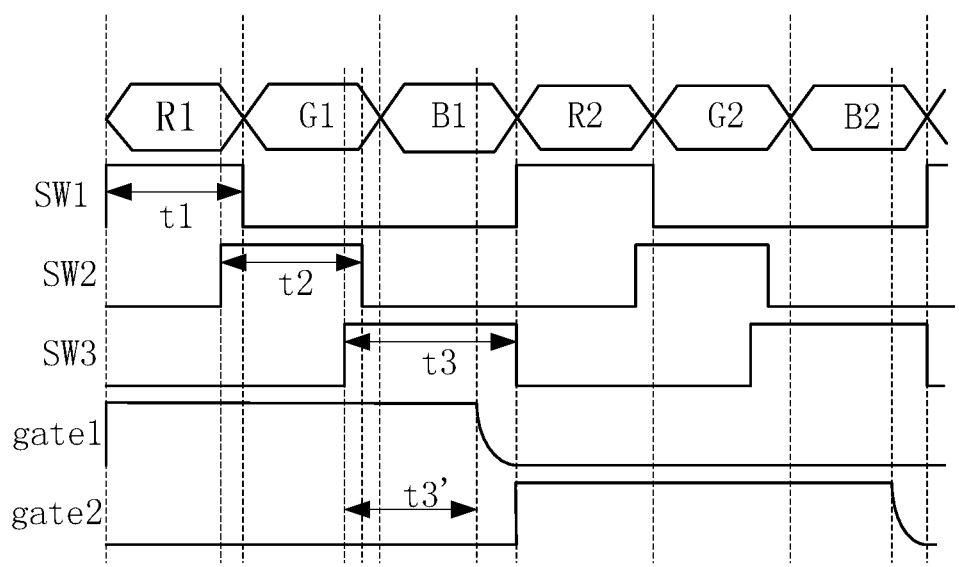
FIG. 12 is a signal diagram of FIG. 11.

Referring to FIG. 12, a signal diagram of FIG. 11. In this embodiment, each cycle of the data signals may be divided into a first sub-cycle, a second sub-cycle, and a third sub-cycle.

Different from the fourth embodiment described above, the rising edge of the second control signal SW2 is also ahead of time herein, but the duration of the high level is not changed.

Specifically, the rising edge and the falling edge for the high level of the first control signal SW1 may correspond to the starting and ending times of the first sub-cycle respectively; the rising edge for the high level of the second control signal SW2 may be earlier than the ending time of the first sub-cycle, and the second switch T2 may be turned on in advance. During this period, the first sub-pixel and the second sub-pixel are simultaneously charged. Then the first control signal SW1 is lowered to a low level, the first switch T1 is turned off, and the first sub-pixel stops charging; the second control signal SW2 is still at the high level and the second switch T2 remains ON. Before the end of the second sub-cycle, the third switch T3 is turned on in advance, during which the second sub-pixel and the third sub-pixel are simultaneously charged. Then, the second control signal SW2 falls to a low level, the second switch T2 turns off, and the second sub-pixel stops charging; the third control signal SW3 still maintains a high level, the third switch T3 is kept ON, and the third sub-pixel continues to be charged; the third switch T3 is not turned off until the end of the third sub-cycle.

In the present embodiment, the simultaneous charging of the first sub-pixel and the second sub-pixel has a same time length as the simultaneous charging of the second sub-pixel and the third sub-pixel.

Figure 13:
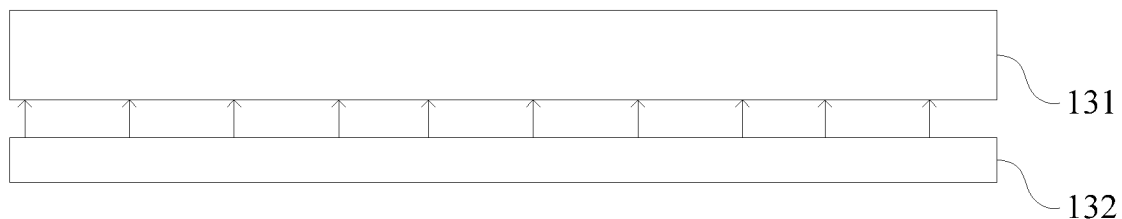
FIG. 13 is a schematic structural view of a display according to an embodiment of the present disclosure.

Referring to FIG. 13, a schematic structural view of a display according to an embodiment of the present disclosure is depicted. The display may be a liquid crystal display.

The liquid crystal display may include a liquid crystal panel 131 and a backlight module 132. A binding area of the liquid crystal panel 131 may be provided with a driver circuit. The driver circuit may be a multiplexed type driver circuit as provided in each of the embodiments above.

It can be understood that the multiplexed type driver circuit may include a plurality of driving units. Each driver circuit is specifically configured to drive three adjacent columns of sub-pixels, and ON and OFF of each switch may be controlled through a gate signal and a control signal to achieve circuit driving. For the specific structure and signal of the circuit, reference may be made to each of the embodiments above.

The foregoing are only the implementing modes of the present disclosure, which are not intended to limit the scope of the present disclosure. Any equivalent structure or equivalent process transformation made using the contents of the description and the accompanying drawings of the present disclosure, or directly or indirectly applied in other related technical fields, is similarly included in the protection scope of the present disclosure.

What is claimed is:

1. A multiplexed type driver circuit, applied to a display, comprising a plurality of scan signal lines, a plurality of data signal lines, and arrayed sub-pixels defined by the plurality of scan lines and the plurality of data lines;
   the multiplexed type driver circuit further comprising:
   a first switch, a second switch and a third switch, each of which comprising an input end configured to input a data signal and an output end;
   a fourth switch comprising an input end coupled to the output end of the first switch and an output end coupled to a first sub-pixel;
   a fifth switch comprising an input end coupled to the output end of the second switch and an output end coupled to a second sub-pixel; and
   a sixth switch comprising an input end coupled to the output end of the third switch and an output end coupled to a third sub-pixel;
   wherein the first sub-pixel, the second sub-pixel and the third sub-pixel are in a same pixel unit, the first sub-pixel is a red sub-pixel, the second sub-pixel is a green sub-pixel and the third sub-pixel is a blue sub-pixel, the first switch, the second switch, the third switch, the fourth switch, the fifth switch and the sixth switch are N-type field effect transistors;
   wherein the multiplexed type driver circuit performs the driving in the following manner:
   turning on the fourth switch, the fifth switch and the sixth switch;
   controlling ON and OFF of the first switch to input a data signal to the first sub-pixel;
   controlling ON and OFF of the second switch to input a data signal to the second sub-pixel;
   controlling ON of the third switch and OFF of the sixth switch to input a data signal to the third sub-pixel; and
   turning off the third switch after turning off the sixth switch;
   wherein the durations of data signals input to the first sub-pixel, the second sub-pixel and the third sub-pixel are identical;
   wherein each cycle of the data signals comprises a first sub-cycle, a second sub-cycle and a third sub-cycle in sequence;
   the first switch is turned on at the start of the first sub-cycle, and turned off before the end of the first sub-cycle; the second switch is turned on at the start of the second sub-cycle, and turned off before the end of the second sub-cycle; and the third switch is turned on at the start of the third sub-cycle, and the sixth switch is turned off before the end of the third sub-cycle; or
   the first switch is turned on after the start of the first sub-cycle, and turned off at the end of the first sub-cycle; the second switch is turned on after the start of the second sub-cycle, and turned off at the end of the second sub-cycle; and the third switch is turned on at the start of the third sub-cycle, and the sixth switch is turned off before the end of the third sub-cycle; or
   the first switch is turned on at the start of the first sub-cycle, and turned off at the end of the first sub-cycle; the second switch is turned on at the start of the second sub-cycle, and turned off at the end of the second sub-cycle; and the third switch is turned on before the start of the third sub-cycle, and the sixth switch is turned off before the end of the third sub-cycle; or
   the first switch is turned on at the start of the first sub-cycle, and turned off at the end of the first sub-cycle; the second switch is turned on before the start of the second sub-cycle, and turned off before the end of the second sub-cycle; and the third switch is turned on before the start of the third sub-cycle, and the sixth switch is turned off before the end of the third sub-cycle.

2. The multiplexed type driver circuit according to claim 1, wherein the first switch comprises a control end for inputting a first control signal to control ON and OFF of the first switch, the second switch comprises a control end for inputting a second control signal to control ON and OFF of the second switch, and the third switch comprises a control end for inputting a third control signal to control ON and OFF of the third switch, and
   each of the fourth switch, the fifth switch and the sixth switch comprises a control end, the control end of the fourth switch, the control end of the fifth switch and the control end of the sixth switch input a same scan driving signal to simultaneously control ON and OFF of the fourth switch, the fifth switch and the sixth switch.

3. A method for driving a multiplexed type driver circuit, wherein the multiplexed type driver circuit comprises:
   a first switch, a second switch and a third switch, each of which comprising an input end configured to input a data signal and an output end;
   a fourth switch comprising an input end coupled to the output end of the first switch and an output end coupled to a first sub-pixel;
   a fifth switch comprising an input end coupled to the output end of the second switch and an output end coupled to a second sub-pixel; and
   a sixth switch comprising an input end coupled to the output end of the third switch and an output end coupled to a third sub-pixel;
   wherein the first sub-pixel, the second sub-pixel and the third sub-pixel are in a same pixel unit;
   wherein the driving method comprises:
   turning on the fourth switch, the fifth switch and the sixth switch;
   controlling ON and OFF of the first switch to input a data signal to the first sub-pixel;
   controlling ON and OFF of the second switch to input a data signal to the second sub-pixel;
   controlling ON of the third switch and OFF of the sixth switch to input a data signal to the third sub-pixel; and
   turning off the third switch after turning off the sixth switch;

wherein the durations of data signal input to the first sub-pixel, the second sub-pixel and the third sub-pixel are identical;

wherein each cycle of the data signals comprises a first sub-cycle, a second sub-cycle and a third sub-cycle in sequence;

the controlling ON and OFF of the first switch comprises: turning on the first switch at the start of the first sub-cycle and turning off the first switch before the end of the first sub-cycle; the controlling ON and OFF of the second switch comprises: turning on the second switch at the start of the second sub-cycle and turning off the second switch before the end of the second sub-cycle; and the controlling ON of the third switch and OFF of the sixth switch comprises: turning on the third switch at the start of the third sub-cycle, and turning off the sixth switch before the end of the third sub-cycle; or the controlling ON and OFF of the first switch comprises: turning on the first switch after the start of the first sub-cycle and turning off the first switch at the end of the first sub-cycle; the controlling ON and OFF of the second switch comprises: turning on the second switch after the start of the second sub-cycle and turning off the second switch at the end of the second sub-cycle; and the controlling ON of the third switch and OFF of the sixth switch comprises: turning on the third switch at the start of the third sub-cycle, and turning off the sixth switch before the end of the third sub-cycle; or the controlling ON and OFF of the first switch comprises: turning on the first switch at the start of the first sub-cycle and turning off the first switch at the end of the first sub-cycle; the controlling ON and OFF of the second switch comprises: turning on the second switch at the start of the second sub-cycle and turning off the second switch at the end of the second sub-cycle; and the controlling ON of the third switch and OFF of the sixth switch comprises: turning on the third switch before the start of the third sub-cycle, and turning off the sixth switch before the end of the third sub-cycle; or the controlling ON and OFF of the first switch comprises: turning on the first switch at the start of the first sub-cycle and turning off the first switch at the end of the first sub-cycle; the controlling ON and OFF of the second switch comprises: turning on the second switch before the start of the second sub-cycle and turning off the second switch before the end of the second sub-cycle; and the controlling ON of the third switch and OFF of the sixth switch comprises: turning on the third switch before the start of the third sub-cycle, and turning off the sixth switch before the end of the third sub-cycle.

4. The method according to claim 3, wherein the first switch comprises a control end for inputting a first control signal to control ON and OFF of the first switch, the second switch comprises a control end for inputting a second control signal to control ON and OFF of the second switch, and the third switch comprises a control end for inputting a third control signal to control ON and OFF of the third switch ;and each of the fourth switch, the fifth switch and the sixth switch comprises a control end, the control end of the fourth switch, the control end of the fifth switch and the control end of the sixth switch input a same scan driving signal to simultaneously control ON and OFF of the fourth switch, the fifth switch and the sixth switch.

5. The method according to claim 3, wherein the first sub-pixel is a red sub-pixel, the second sub-pixel is a green sub-pixel and the third sub-pixel is a blue sub-pixel.

6. The method according to claim 3, wherein the first switch, the second switch, the third switch, the fourth switch, the fifth switch and the sixth switch are N-type field effect transistors.

7. A display, comprising a multiplexed type driver circuit, the multiplexed type driver circuit comprising:

a first switch, a second switch and a third switch, each of which comprising an input end configured to input a data signal and an output end; and a fourth switch comprising an input end coupled to the output end of the first switch and an output end coupled to a first sub-pixel;

a fifth switch comprising an input end coupled to the output end of the second switch and an output end coupled to a second sub-pixel; and a sixth switch comprising an input end coupled to the output end of the third switch and an output end coupled to a third sub-pixel;

wherein the first sub-pixel, the second sub-pixel and the third sub-pixel are in a same pixel unit, wherein the multiplexed type driver circuit performs the driving in the following manner:

turning on the fourth switch, the fifth switch and the sixth switch;

controlling ON and OFF of the first switch to input a data signal to the first sub-pixel;

controlling ON and OFF of the second switch to input a data signal to the second sub-pixel;

controlling ON of the third switch and OFF of the sixth switch to input a data signal to the third sub-pixel; and turning off the third switch after turning off the sixth switch;

wherein the durations of data signal input to the first sub-pixel, the second sub-pixel and the third sub-pixel are identical;

wherein each cycle of the data signals comprises a first sub-cycle, a second sub-cycle and a third sub-cycle in sequence;

the first switch is turned on at the start of the first sub-cycle, and turned off before the end of the first sub-cycle; the second switch is turned on at the start of the second sub-cycle, and turned off before the end of the second sub-cycle; and the third switch is turned on at the start of the third sub-cycle, and the sixth switch is turned off before the end of the third sub-cycle; or the first switch is turned on after the start of the first sub-cycle, and turned off at the end of the first sub-cycle; the second switch is turned on after the start of the second sub-cycle, and turned off at the end of the second sub-cycle; and the third switch is turned on at the start of the third sub-cycle, and the sixth switch is turned off before the end of the third sub-cycle; or the first switch is turned on at the start of the first sub-cycle, and turned off at the end of the first sub-cycle; the second switch is turned on at the start of the second sub-cycle, and turned off at the end of the second sub-cycle; and the third switch is turned on before the start of the third sub-cycle, and the sixth switch is turned off before the end of the third sub-cycle; or the first switch is turned on at the start of the first sub-cycle, and turned off at the end of the first sub-cycle; the second switch is turned on before the start of the second sub-cycle, and turned off before the end of the second sub-cycle; and the third switch is turned on before the start of the third sub-cycle, and the sixth switch is turned off before the end of the third sub-cycle.

8. The display to claim 7, wherein the first switch comprises a control end for inputting a first control signal to control ON and OFF of the first switch, the second switch comprises a control end for inputting a second control signal to control ON and OFF of the second switch, and the third switch comprises a control end for inputting a third control signal to control ON and OFF of the third switch, and
   each of the fourth switch, the fifth switch and the sixth switch comprises a control end, the control end of the fourth switch, the control end of the fifth switch and the control end of the sixth switch input a same scan driving signal to simultaneously control ON and OFF of the fourth switch, the fifth switch and the sixth switch.

\* \* \* \* \*